(12) United States Patent
James et al.

(10) Patent No.: US 7,126,804 B1
(45) Date of Patent: Oct. 24, 2006

(54) SPARK GAP

(75) Inventors: Lewis James, Clarence Center, NY (US); Scott Gorny, Amherst, NY (US)

(73) Assignee: Diversified Control, Inc., Orchard Park, NY (US)

( * ) Notice: Subject to any disclaimer, the term of this patent is extended or adjusted under 35 U.S.C. 154(b) by 421 days.

(21) Appl. No.: 10/613,227

(22) Filed: Jul. 3, 2003

Related U.S. Application Data

(60) Provisional application No. 60/394,004, filed on Jul. 3, 2002.

(51) Int. Cl.
*H02H 1/00* (2006.01)

(52) U.S. Cl. ..................................... 361/117

(58) Field of Classification Search ............... 361/91.1, 361/119, 117, 56
See application file for complete search history.

(56) References Cited

U.S. PATENT DOCUMENTS

| | | | | |
|---|---|---|---|---|
| 2,457,102 A | * | 12/1948 | Jones | 313/575 |
| 4,160,210 A | | 7/1979 | Molinari | 325/362 |
| 4,309,736 A | | 1/1982 | Lissillour | 361/119 |
| 4,438,365 A | | 3/1984 | Atkinson | 313/325 |
| 4,527,215 A | * | 7/1985 | Wessing | 361/124 |
| 4,586,104 A | | 4/1986 | Standler | 361/91 |
| 4,586,105 A | | 4/1986 | Lippmann et al. | 361/117 |
| 4,828,506 A | | 5/1989 | Tuckwood | 439/181 |
| 4,963,966 A | | 10/1990 | Harney et al. | 358/349 |
| 5,029,041 A | | 7/1991 | Robinson et al. | 361/220 |
| 5,933,307 A | | 8/1999 | West | 361/56 |
| 5,969,924 A | | 10/1999 | Noble | 361/56 |
| 6,011,682 A | | 1/2000 | Storey | 361/117 |
| 6,059,983 A | * | 5/2000 | Noble | 427/96.4 |
| 6,493,198 B1 | * | 12/2002 | Arledge et al. | 361/56 |
| 6,600,642 B1 | * | 7/2003 | Karnes | 361/119 |
| 2002/0024791 A1 | | 2/2002 | Whitney et al. | 361/119 |

FOREIGN PATENT DOCUMENTS

GB 2053579 2/1981

* cited by examiner

*Primary Examiner*—Stephen W. Jackson
*Assistant Examiner*—Boris Benenson
(74) *Attorney, Agent, or Firm*—Walter W. Duft

(57) ABSTRACT

A spark gap for protecting an electrical circuit from voltage surges includes a first electrical circuit trace element having a first end face of defined thickness and length, and a second electrical circuit trace element having a second end face of defined thickness and length. The first and second end faces are spaced from each other along their respective lengths to provide an air gap having a defined gap width. The gap width is of a size to provide a required spark gap breakover voltage under design conditions of temperature, humidity and air pressure. The air gap also has a defined gap length corresponding to the length of the first and second end faces. The gap length is of a size that maximizes spark gap life over repeated discharge cycles without introducing undesirable amounts of capacitance.

23 Claims, 3 Drawing Sheets

SPARK GAP

CROSS-REFERENCE TO RELATED APPLICATIONS

This application claims the benefit under 35 U.S.C. 119(e) of U.S. Provisional Patent Application Ser. No. 60/394,004, filed on Jul. 3, 2002, entitled "Spark Gap."

BACKGROUND OF THE INVENTION

1. Field of the Invention

This invention relates to the electronics art, and more particularly to spark gap devices for the protection of circuit components against the effects of spurious voltage surges caused by lightning strikes, appliances, and other sources.

2. Description of the Prior Art

Spark gaps have been in service for many years in various circuits for various purposes. They are used principally to limit voltage excursions by shunting large voltage surges over a safe discharge pathway that bypasses other circuit components. Such voltage excursions can be caused by lightning strikes, appliances and other sources such as electrostatic discharge. Examples of electronic devices requiring voltage protection include cable television splitters, computers, cable modems, stereo and television equipment, to name but a few. All of these devices contain one or more printed circuit boards (PCBs) made from fiberglass or other suitable substrates with laminated copper traces formed thereon to electrically interconnect the mounted circuit components.

Unlike other surge protection devices such as metal oxide varistors, gas discharge tubes, thyristors and the like, spark gaps have the benefit of low cost and ease of manufacture. They can be formed on a PCB by positioning a pair of copper traces at a predetermined distance from each other to establish a controlled point of discharge for unwanted transient potentials that exceed a threshold breakover voltage. Examples of conventional PCB spark gaps are shown in U.S. Pat. No. 5,933,307 of West, U.S. Pat. No. 5,969,924 of Noble, and U.S. Pat. No. 4,586,105 of Lippmann et al. The '307 patent of West discloses a PCB spark gap comprising a pair of spaced copper traces separated by a slot formed in the PCB. The '924 patent of Noble discloses a PCB spark gap comprising a pair of serpentine circuit traces formed in a closely spaced nested arrangement. The '105 patent of Lippman et al. discloses a PCB spark gap comprising a pair of circuit traces formed with opposing pointed tips that are closely spaced from each other.

A disadvantage of PCB spark gaps is that the PCB surface and copper trace material degrades with each discharge due to vaporization of the copper material. Over time, the spacing of the spark gap increases due to the repeated degradation of the copper material. This changes the operating point of the spark gap by increasing the breakover voltage required to produce an arc across the gap. Insofar as the spark gap is built into the circuit board at the time of manufacture, it cannot be replaced or repaired, and the entire circuit board must ultimately be replaced if surge protection is to be maintained.

Various prior art solutions have been proposed to overcome this problem. In the '307 patent of West, it is stated that this problem can be addressed by increasing the circuit trace foil thickness, or by increasing the length of the slot (while retaining the same width), or by providing multiple spark gaps spaced serially from each other such that energy is dissipated in stages. Because the latter solutions are said to monopolize valuable PCB surface area, West proposes an alternative solution of forming part of a spark gap from surface mount components and solder fillets used to mount the components. Another solution to the problem of PCB spark gap degradation is found in British Patent No. GB2053579 of Griffiths et al. This patent discloses multi-fingered spark gaps in which the fingers are inclined to increase their length, thus enabling each finger to survive a longer period of burning.

It is to further improvement in the design of PCB spark gaps that the present invention is directed.

SUMMARY OF THE INVENTION

It is a primary object of the invention to provide a new and improved PCB spark gap wherein the effects of repeated discharge are ameliorated and spark gap life is improved.

It is a further object of the invention to provide such a spark gap without having to provide localized increases in circuit trace thickness, PCB slots, multiple serial spark gaps, or multi-fingered circuit trace configurations.

It is a further object of the invention to provide such a spark gap without introducing undesirable electrical characteristics, such as capacitance, into the circuit.

It is a further object of the invention to provide such a spark gap in which the electrical characteristics are suitable for cable television applications such as splitters, taps and the like.

The foregoing objects are achieved and an advance in the art is provided by a novel spark gap for protecting an electrical circuit from voltage surges that is formed using printed circuit board trace elements. The spark gap includes a first electrical circuit trace element having a first end face of defined thickness and length, and a second electrical circuit trace element having a second end face of defined thickness and length. The first and second end faces are spaced from each other along their respective lengths to provide an air gap having a defined gap width. The gap width is of a size to provide a required spark gap breakover voltage under design conditions of temperature, humidity and air pressure. The air gap also has a defined gap length corresponding to the length of the first and second end faces. The gap length is of a size that maximizes spark gap life over repeated discharge cycles without introducing undesirable amounts of capacitance.

BRIEF DESCRIPTION OF THE DRAWING FIGURES

The foregoing and additional advantages and characterizing features of the present invention will become clearly apparent upon a reading of the ensuing detailed description together with the ensuing detailed description wherein.

DETAILED DESCRIPTION OF PREFERRED EMBODIMENTS

Figure 1:
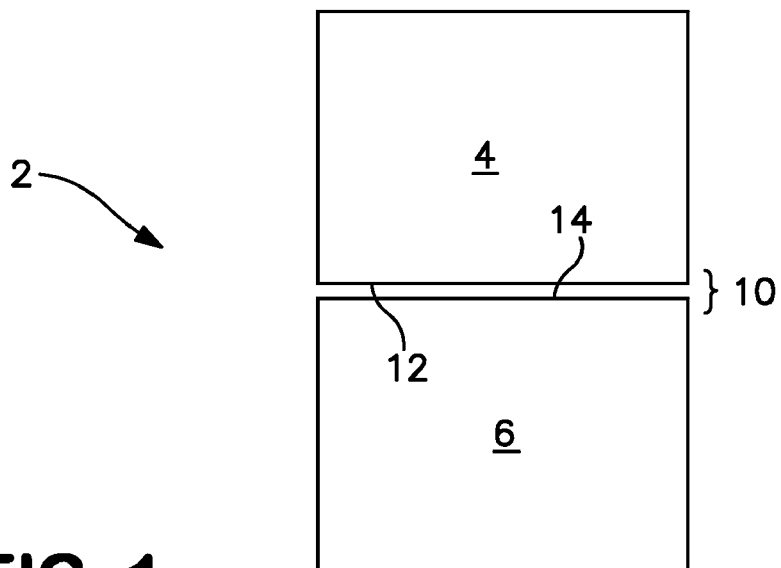
FIG. 1 is a plan view showing a pair of spaced circuit trace elements providing an exemplary spark gap in accordance with the invention.
Figure 2:
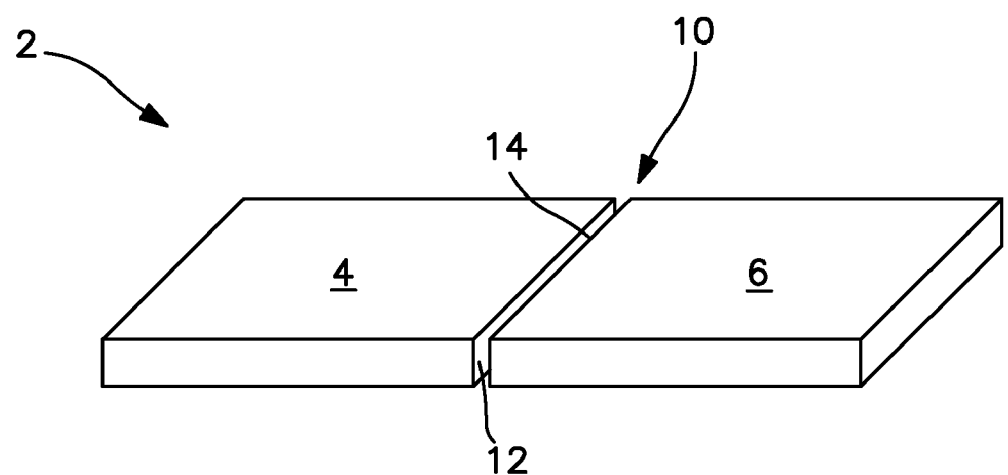
FIG. 2 is a perspective view of the spark gap of FIG. 1.

Turning now to the Figures, in which like reference numerals indicate like elements in all of the several views, FIGS. 1 and 2 illustrate a spark gap 2 for protecting an electrical circuit from voltage surges. The spark gap 2 is formed using PCB electrical trace material (such as copper or other suitable material), which can be formed over a PCB substrate (such as fiberglass or other suitable material). As long as the gap width of the spark gap 2 is not too small (see below), the spark gap 2 can be patterned using etching or other conventional techniques. The spark gap 2 includes first and second electrical trace elements 4 and 6 separated by an air gap 10. The first electrical circuit trace element 4 has a first end face 12 of defined thickness and length. The second electrical circuit trace element 6 has a second end 14 face of defined thickness and length. In most cases, the length of each end face 12 and 14 will be the same, although different lengths could also be used. The end faces 12 and 14 will also usually be of substantially equal thickness, such that the end faces are rectangular in shape, although different thicknesses and shapes could be used if desired.

The air gap 10 is formed by spacing the first and second end faces 12 and 14 from each other along their respective lengths. The gap width will normally be substantially uniform over the length of the end faces 12 and 14, but variable spacing might be desirable in some applications. The selected spacing between the end faces 12 and 14 defines the gap width of the air gap 10. The gap width is selected to provide a required spark gap breakover voltage under design conditions of temperature, humidity and air pressure, as can be determined using conventional techniques. An exemplary gap width might be 0.005, but other values could also be used, as described in more detail below.

The air gap also has a defined gap length corresponding to the length of the first and second end faces 12 and 14. This gap length is selected so as to be very large relative to the gap width in order to provide a large sacrificial area in which degradation can occur along the first and second end faces during spark gap discharge, while preserving the spark gap's breakover voltage threshold at a desired level. Providing a long gap length increases the amount of material that can be lost to vaporization while still maintaining properly spaced opposing air gap regions. For example, it is expected that the first and second end faces will become pitted due to localized vaporization of the end face material at each location where a discharge occurs across the gap. Although the gap width at each pitted area may be out of tolerance with respect to design gap width, other regions lying between the pitted areas will maintain the original gap width, providing discharge pathways at the required breakover voltage. Only when the spark gap 2 incurs so many discharge cycles that the substantial entirety of each end face 12 and 14 is damaged will the spark gap begin to fail at its design voltage level.

Generally speaking, the larger the gap length, the longer the spark gap 2 will remain operational. However, a countervailing consideration that restricts gap length is the capacitance introduced into the circuit. The capacitance across the spark gap 2 is determined by the length and width of the air gap 10, and the thickness of the PCB electrical trace material (according to well known principles of electrical capacitance).

Because the gap width is fixed by the required voltage breakover threshold and the PCB electrical trace material is of fixed thickness, the only remaining variable that can be controlled to limit capacitance is the gap length. It is thus contemplated by the invention that the gap length will be optimally selected so as to be of a size that maximizes spark gap life over repeated discharge cycles, but without introducing undesirable amounts of capacitance. The precise gap length will vary according to the intended application of the spark gap 2, and will depend on the required number of discharge cycles and the electrical characteristics of the circuit in which the spark gap is incorporated.

Figure 3:
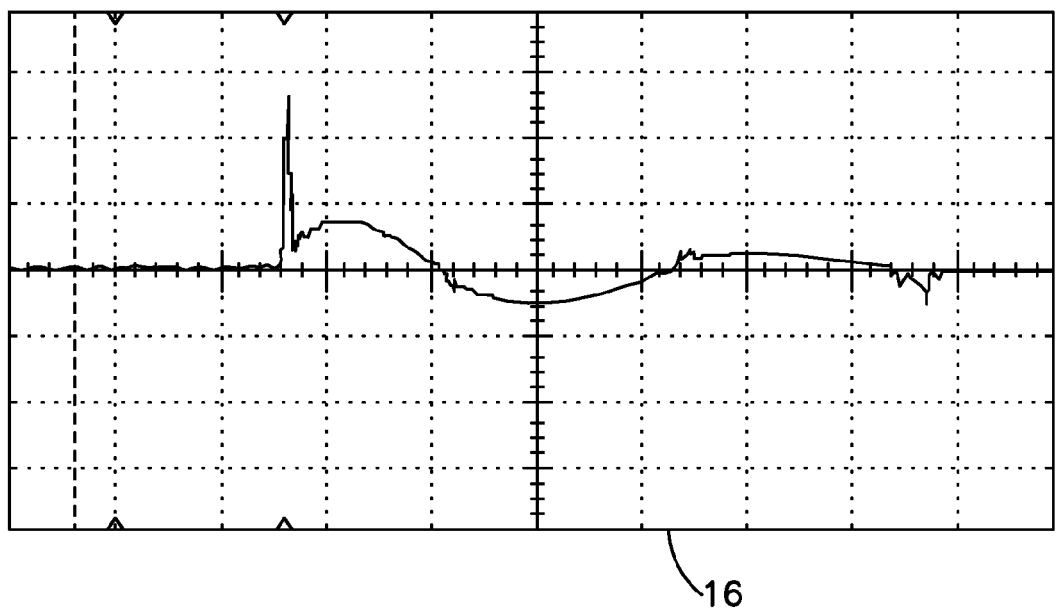
FIG. 3 is a graph showing a plot of voltage versus time in a circuit protected by a spark gap as constructed in FIG. 1 as a +6 kV, 200 A, 100 kHz ringwave voltage surge is discharged across the spark gap.

In cable television applications, the frequencies span from approximately 5 MHz to 1 GHz. The capacitance of a spark gap used in such applications will preferably need to be held to less than a picofarad, or other circuitry will need to be added to compensate. Surge compliance testing of cable television equipment is often done by applying a 6 kV, 200 A, 100 kHz ringwave. If the gap width is maintained below 0.005 inches, a breakover voltage of less than approximately 700 volts can be achieved. This is shown in the plot 16 of FIG. 3, in which the dotted line divisions along the vertical axis represent 1000 volt increments and the dotted line divisions along the horizontal axis represent 2.0 microsecond increments. If the initial 2700 volt spike of very short duration is ignored, it will be seen that the maximum amplitude of the remaining ring-shaped waveform is approximately 700 volts. Circuit design and component selection can be made to easily tolerate these excursions. With a gap width of 0.005 inches, achieving capacitance levels of less than one picofarad will require that the gap length be no more than 0.25 inches. Thus, the gap length will be larger than the gap width by no more than a factor of one hundred.

Smaller gap widths will produce lower breakover voltages, but cannot be easily formed using conventional circuit trace etching techniques. For cable television applications, gap widths as low as 0.0015–0.002 inches can be used to provide a breakover voltage of less than 1000 volts. Applicants have produced such spark gaps but a laser technique was used to form the spark gap. In particular, a YAG (Yttrium Aluminum Garnet) laser was used to vaporize a copper trace with very high precision in the desired gap width range of 0.0015–0.002 inches.

Figure 4:
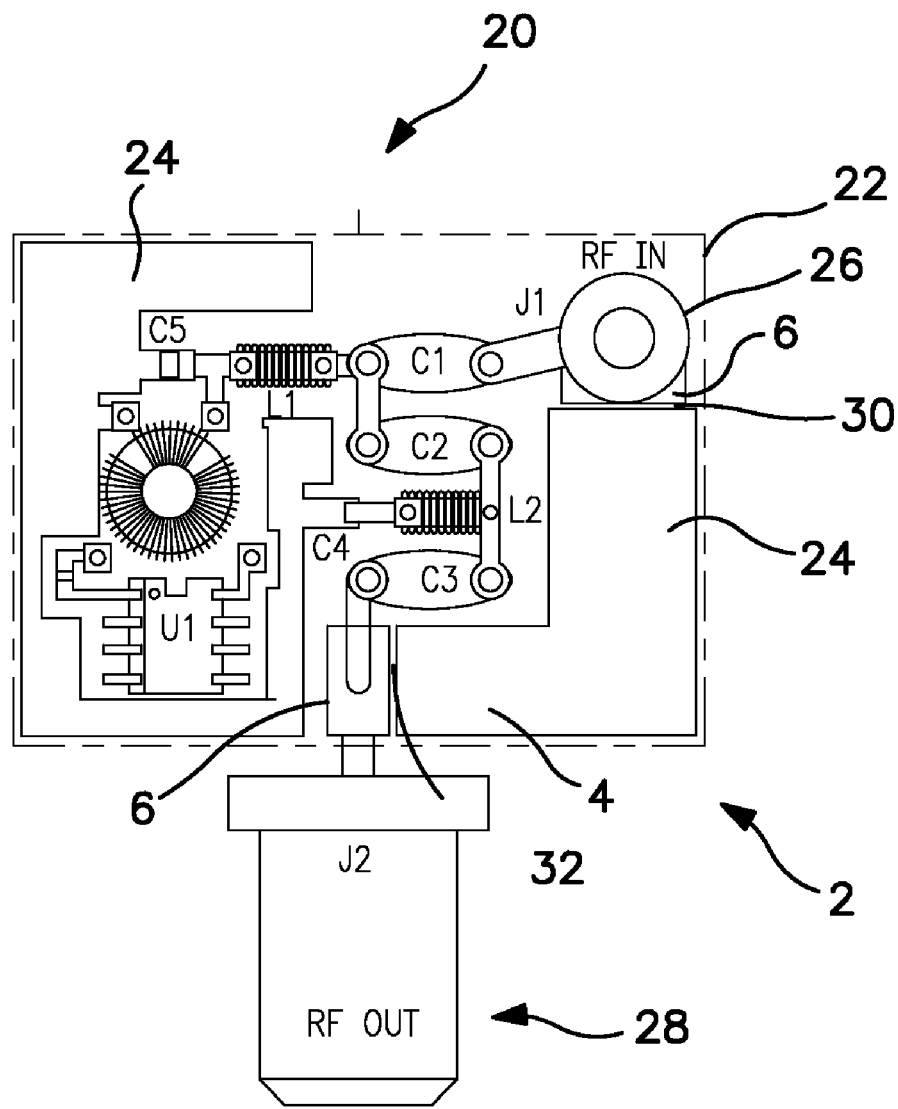
FIG. 4 is a schematic diagram in which a spark gap as constructed in FIG. 1 is provided between the RF input and RF output of a cable television circuit.

FIG. 4 illustrates use of the spark gap 2 on a PCB 20 designed for a cable television application. The PCB 20 includes a substrate 22 made from fiberglass or other suitable material. Plural circuit traces, exemplified by reference numeral 24, are formed on the substrate 22. The circuit traces 24 are formed from copper or other suitable material and are shaped using an etching process or other suitable technique. A plurality of circuit components C1, C2, C3, C4, C5 L1, L2, and U1 are mounted on the PCB 20 and appropriate electrical connections are made to the circuit traces 24. The spark gap 2 is formed between an RF (radio frequency) input 26 and an RF output 28 using a very wide circuit trace pattern (e.g., 0.125–0.25 inches) and a very small gap width (e.g., 0.0015–0.005 inches). The spark gap 2 includes two air gaps 30 and 32. It will be seen that the spark gap 2 allows voltage surges to be shunted around the remaining circuit components in order to protect those circuits from damage.

It is therefore apparent that the present invention accomplishes its, intended objects. While an embodiment of the present invention has been described in detail, that is for the purpose of illustration not limitation.

What is claimed is:

1. A spark gap for protecting an electrical circuit from voltage surges comprising:

a first electrical circuit trace element having a first end face of defined thickness and length;

a second electrical circuit trace element having a second end face of defined thickness and length;

said first and second end faces being spaced from each other along their respective lengths to provide an air gap having a defined gap width;

said gap width being of a size to provide a required spark gap breakover voltage under design conditions of temperature, humidity and air pressure; and said air gap also having a defined gap length corresponding to the length of said first and second end faces, said gap length being of a size that maximizes spark gap life over repeated discharge cycles without introducing undesirable amounts of capacitance.

2. A spark gap according to claim 1, wherein said spark gap is designed for a radio frequency application at a frequency range of 5 MHz to 1 GHz, has a gap width selected to provide a failover voltage of no more than 350–700 volts, and has a gap length selected to develop no more than 1 picofarad of capacitance.

3. A spark gap according to claim 1, wherein said gap length is not more than 0.125–0.25 inches.

4. A spark gap according to claim 1, wherein said gap width is not more than 0.0015–0.005 inches.

5. A spark gap according to claim 1, wherein said gap length is approximately 0.125–0.25 inches and said gap width is approximately 0.0015–0.005 inches.

6. A spark gap according to claim 1, wherein said spark gap has a breakover voltage that does not exceed 350–700 volts.

7. A spark gap according to claim 1, wherein said first and second end faces are of substantially equal length.

8. A spark gap according to claim 1, wherein said first and second end faces are of substantially equal thickness.

9. A spark gap according to claim 1, wherein said first and second end faces are substantially rectangular.

10. A spark gap according to claim 1, wherein said gap width is substantially uniform over said gap length.

11. A method of forming a spark gap for protecting an electrical circuit from voltage surges, comprising:

forming a first electrical circuit trace element with a first end face of defined thickness and length;

forming a second electrical circuit trace element with a second end face of defined thickness and length;

said first and second end faces being spaced from each other along their respective lengths to provide an air gap having a defined gap width;

said gap width being selected based on determination of a required spark gap breakover voltage under design conditions of temperature, humidity and air pressure; and said air gap also having a defined gap length corresponding to the length of said first and second end faces, said gap length being determined empirically based on consideration of maximizing spark gap life over repeated discharge cycles without introducing undesirable amounts of capacitance.

12. A method according to claim 1, wherein said spark gap is designed for a radio frequency application at a frequency range of 5 MHz to 1 GHz, wherein said gap width is selected to provide a failover voltage of no more than 350–700 volts, and wherein said gap length is selected to develop no more than 1 picofarad of capacitance.

13. A method according to claim 11, wherein said gap length is selected to be not more than 0.125–0.25 inches.

14. A method according to claim 11, wherein said gap width is selected to be not more than 0.0015–0.005 inches.

15. A method according to claim 11, wherein said gap length selected to be approximately 0.125–0.25 inches and said gap width is selected to be approximately 0.0015–0.005 inches.

16. A method according to claim 11, wherein said spark gap is designed to have a breakover voltage that does not exceed 350–700 volts.

17. A method according to claim 11, wherein said first and second end faces are formed to be of substantially equal length.

18. A method according to claim 11, wherein said first and second end faces are formed to be of substantially equal thickness.

19. A method according to claim 1, wherein said first and second end faces are formed to be substantially rectangular.

20. A method according to claim 11, wherein said gap width is selected to be substantially uniform over said gap length.

21. A method according to claim 11, wherein said gap width is less than 0.005 inches and said spark gap is formed by laser etching a single electrical circuit trace element into said first and second electrical circuit trace elements.

22. A method according to claim 21 wherein said laser etching is performed using a YAG laser.

23. In a printed circuit board having a substrate, a plurality of printed circuit traces, and one or more circuit components electrically connected to said circuit traces, a spark gap for protecting said one or more circuit component from voltage surges comprising:

a first electrical circuit trace element having a first end face of defined thickness and length;

a second electrical circuit trace element having a second end face of defined thickness and length;

said first and second end faces being spaced from each other along their respective lengths to provide an air gap having a defined gap width;

said gap width being of a size to provide a required spark gap breakover voltage under design conditions of temperature, humidity and air pressure; and said air gap also having a defined gap length corresponding to the length of said first and second end faces, said gap length being of a size that maximizes spark gap life over repeated discharge cycles without introducing undesirable amounts of capacitance.

* * * * *